(12) United States Patent
Fuchida et al.

(10) Patent No.: US 9,685,764 B2
(45) Date of Patent: Jun. 20, 2017

(54) SEMICONDUCTOR OPTICAL ELEMENT AND SURFACE-EMITTING SEMICONDUCTOR OPTICAL ELEMENT

(71) Applicant: Mitsubishi Electric Corporation, Tokyo (JP)

(72) Inventors: Ayumi Fuchida, Tokyo (JP); Naoki Nakamura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/799,087

(22) Filed: Jul. 14, 2015

(65) Prior Publication Data
US 2016/0156154 A1    Jun. 2, 2016

(30) Foreign Application Priority Data
Nov. 28, 2014   (JP) .................. 2014-241903

(51) Int. Cl.
| | | |
|---|---|---|
| H01S 5/00 | (2006.01) | |
| H01S 5/12 | (2006.01) | |
| H01S 3/1055 | (2006.01) | |
| H01S 3/067 | (2006.01) | |
| H01S 5/183 | (2006.01) | |
| H01S 5/20 | (2006.01) | |

(52) U.S. Cl.
CPC .............. *H01S 5/12* (2013.01); *H01S 3/0675* (2013.01); *H01S 3/1055* (2013.01); *H01S 5/1231* (2013.01); *H01S 5/18319* (2013.01); *H01S 5/20* (2013.01)

(58) Field of Classification Search
CPC .......... H01S 5/187; H01S 5/3013; H01S 5/12; H01S 3/1055; H01S 3/0675; H01S 5/18319; H01S 5/1231; H01S 5/20
See application file for complete search history.

(56) References Cited

U.S. PATENT DOCUMENTS

| | | | |
|---|---|---|---|
| 5,289,494 A | 2/1994 | Tada et al. | |
| 6,104,738 A * | 8/2000 | Kitoh ................. | H01S 5/10 372/46.01 |

(Continued)

FOREIGN PATENT DOCUMENTS

| | | | | |
|---|---|---|---|---|
| JP | H05-029705 A | 2/1993 | | |
| JP | 2001168455 A * | 6/2001 | ............... | H01S 5/12 |

(Continued)

*Primary Examiner* — Yuanda Zhang
(74) *Attorney, Agent, or Firm* — Studebaker & Brackett PC

(57) ABSTRACT

A semiconductor optical element has a semiconductor substrate, a diffraction grating, a diffraction grating embedding layer, an active layer and a cladding layer. The diffraction grating includes a plurality of grating elements arranged on the semiconductor substrate along a direction (Z direction) in which laser light is emitted. Each grating element has a lower portion and an upper portion provided on the lower portion. The lower portions of the grating elements are connected to each other to form one layer in a lower section of the diffraction grating. The upper portion has a first refractive index and the lower portion has a second refractive index. A refractive index of the diffraction grating embedding layer is an intermediate value between the first and the second refractive index.

8 Claims, 4 Drawing Sheets

(56) References Cited

U.S. PATENT DOCUMENTS

| | | | | |
|---|---|---|---|---|
| 6,107,112 | A * | 8/2000 | Kito | B82Y 20/00 |
| | | | | 117/953 |
| 6,560,259 | B1 * | 5/2003 | Hwang | B82Y 20/00 |
| | | | | 372/102 |
| 6,678,299 | B1 * | 1/2004 | Inaba | H01S 5/227 |
| | | | | 372/45.01 |
| 8,201,268 | B1 * | 6/2012 | Ho | B82Y 20/00 |
| | | | | 850/52 |
| 2004/0013144 | A1 | 1/2004 | Kise et al. | |
| 2010/0128749 | A1 * | 5/2010 | Amann | H01S 5/18308 |
| | | | | 372/50.11 |
| 2010/0159706 | A1 * | 6/2010 | Qiu | H01J 37/32082 |
| | | | | 438/710 |

FOREIGN PATENT DOCUMENTS

| | | | | |
|---|---|---|---|---|
| JP | 2002-299758 A | 10/2002 | | |
| JP | 2005091001 A | * 4/2005 | | G01D 5/30 |

* cited by examiner

Comparative example

SEMICONDUCTOR OPTICAL ELEMENT AND SURFACE-EMITTING SEMICONDUCTOR OPTICAL ELEMENT

BACKGROUND

Field of the Application

The present application relates to a semiconductor optical element and a surface-emitting semiconductor optical element.

Background Art

A distributed feedback laser element (DFB-LD) having a complex coupling type of diffraction grating provided in a resonator, as described in Japanese Patent Laid-Open No. 2002-299758 or 5-29705 is known. In Japanese Patent Laid-Open No. 2002-299758, refractive-index-coupling-type, gain-coupling-type and complex-coupling-type DFB lasers are contrasted with each other, as described below. In a refractive-index-coupling-type DFB laser, only the real part of a complex refractive index changes periodically in a resonator. That is, this type of laser is a semiconductor laser element having in a resonator a diffraction grating having the refractive index periodically changed. In a gain-coupling-type DFB laser, only the imaginary part of a complex refractive index changes periodically in a resonator. That is, this type of laser is a semiconductor laser element having in a resonator a diffraction grating having a gain periodically changed or having a loss periodically changed. A complex-coupling-type DFB laser is a type of semiconductor laser element in which both the real part and the imaginary part of a complex refractive index change periodically in a resonator.

A gain-coupling-type diffraction grating includes a light-absorbing layer and therefore has a problem of the threshold current being increased, a problem of the slope efficiency being reduced and a problem of the power consumption being high. In a case where a refractive-index-coupling diffraction grating is used, these problems can be avoided.

In a process of manufacturing a DFB laser, a diffraction grating is formed by etching, a diffraction grating embedding layer is thereafter grown and a light confinement layer, and active layer or the like is provided on this diffraction grating embedding layer. If in this process the diffraction grating is formed deeper than that specified with a design value due to manufacturing variation, the distance between the diffraction grating and the light confinement layer, the active layer or the like is smaller than the target design value. In this case, there is a problem of an optical coupling coefficient becoming larger than the target design value. For example, according to one of methods for avoiding this problem, the thickness of the diffraction grating embedding layer may be changed with reference to the diffraction grating depth so that the distance between the diffraction grating and the light confinement layer equals the design value. This method, however, entails a problem that the manufacturing efficiency is reduced.

In a surface-emitting semiconductor optical element, a periodic structure layer which periodically changes the refractive index along planar directions is provided. A variation in etching depth can occur with this periodic structure layer, as in the case of the diffraction grating, resulting in occurrence of an in-plane variation in optical coupling coefficient.

SUMMARY

In view of the above-described problems, an object of the present invention is to provide a semiconductor optical element and a surface-emitting semiconductor optical element capable of limiting a variation in an optical coupling coefficient due to a variation in depth of a refractive index coupling type of diffraction grating or periodic structure layer.

A first aspect of the present invention is a semiconductor optical element that includes: a semiconductor substrate; a refractive-index-coupling-type diffraction grating; a diffraction grating embedding layer; and an active layer or an optical waveguide layer. The refractive-index-coupling-type diffraction grating includes a plurality of grating elements arranged on the semiconductor substrate, and each of the grating elements includes a lower portion provided on the semiconductor substrate and an upper portion provided on the lower portion. The upper portion has a first refractive index, and the lower portion has a second refractive index lower than the first refractive index. The diffraction grating embedding layer is laid on the diffraction grating so that the diffraction grating is embedded. The diffraction grating embedding layer has a refractive index lower than the first refractive index and different from the second refractive index. The active layer or the optical waveguide layer is laid on the diffraction grating embedding layer so that the diffraction grating embedding layer is interposed between the diffraction grating and the active layer or the optical waveguide layer.

A second aspect of the present invention is a semiconductor optical element that includes: a semiconductor substrate; a refractive-index-coupling-type diffraction grating; a diffraction grating embedding layer; and an active layer or an optical waveguide layer. The refractive-index-coupling-type diffraction grating includes a plurality of grating elements arranged on the semiconductor substrate, and each of the grating elements has a lower portion provided on the semiconductor substrate and an upper portion provided on the lower portion. The lower portion is formed of a material having an etching rate lower than that of the upper portion. The diffraction grating embedding layer is laid on the diffraction grating so that the diffraction grating is embedded. The diffraction grating embedding layer has a refractive index lower than the refractive index of the upper portion. The active layer or the optical waveguide layer is laid on the diffraction grating embedding layer so that the diffraction grating embedding layer is interposed between the diffraction grating and the active layer or the optical waveguide layer.

A third aspect of the present invention is a surface-emitting semiconductor optical element that includes: a refractive-index-coupling-type periodic structure layer; an embedding layer; and an active layer laid on the embedding layer. The refractive-index-coupling-type periodic structure layer has projections and recesses periodically arranged in planar directions. A first portion is on the projection side. A second portion is positioned on the recess side and has a refractive index lower than that of the first portion. The embedding layer is laid on the periodic structure layer so as to cover the first portion and the second portion. The embedding layer has a refractive index lower than the refractive index of the first portion and different from the refractive index of the second portion.

Other and further objects, features and advantages of the invention will appear more fully from the following description.

DETAILED DESCRIPTION OF THE PREFERRED EMBODIMENTS

First Embodiment

Figure 1:
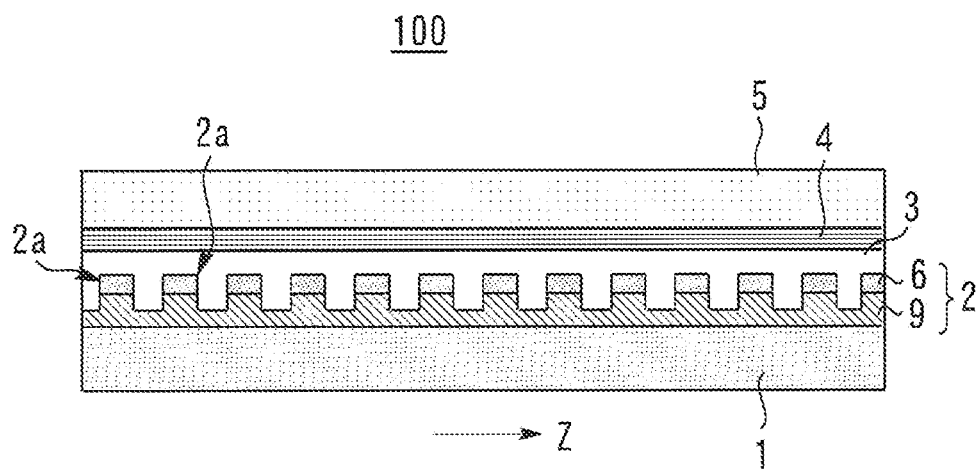
FIG. 1 is a sectional view of a semiconductor optical element according to a first embodiment of the present invention.

FIG. 1 is a sectional view of a semiconductor optical element 100 according to a first embodiment of the present invention. The semiconductor optical element 100 according to the first embodiment is a refractive-index-coupling-type feedback laser element (DFB laser element). The semiconductor optical element 100 has a semiconductor substrate 1 and a diffraction grating 2, a diffraction grating embedding layer 3, an active layer 4 and a cladding layer 5 successively stacked on the semiconductor substrate 1. The semiconductor substrate 1 is an n-type InP substrate containing S as a dopant. The semiconductor substrate 1 may alternatively be a p-type InP substrate containing Zn as a dopant.

The refractive-index-coupling-type diffraction grating 2 is provided on the semiconductor substrate 1 and is formed of an InGaAsP-based material. The refractive index of the diffraction grating 2 provided in the resonator is periodically changed. The provision of the diffraction grating 2 enables periodically changing only the real part of the complex refractive index in the resonator, thus obtaining a refractive-index-coupling-type feedback laser element (DFB laser element). With the diffraction grating 2, only the real part of the complex refractive index is periodically changed, thereby enabling provision of a feedback only on a particular wavelength. The diffraction grating 2 includes a plurality of grating elements 2a arranged on the semiconductor substrate 1 along a direction (Z direction) in which laser light is emitted. Each of the grating elements 2a has a lower portion 9 and an upper portion 6 provided on the lower portion 9. The lower portions 9 of the grating elements 2a are connected to each other to form one layer in a lower section of the diffraction grating 2. The upper portion 6 has a first refractive index $n_1$, and the lower portion 9 has a second refractive index $n_2$ ($n_2 < n_1$). The refractive index is gradually reduced with change in position from the upper portion 6 to the lower portion 9.

The diffraction grating embedding layer 3 is laid on the diffraction grating 2 so as to embed the diffraction grating 2. The diffraction grating embedding layer 3 has a refractive index no lower than that of the upper portion 6 and different from that of the lower portion 9. The diffraction grating embedding layer 3 is formed of an InGaAsP-based material. For convenience sake, the refractive index of the diffraction grating embedding layer 3 is expressed as $n_0$; the refractive index of the upper portion 6 of the diffraction grating 2, $n_1$; and the refractive index of the lower portion 9 of the diffraction grating 2, $n_2$. The refractive index no of the diffraction grating embedding layer 3 is an intermediate value between $n_1$ and $n_2$. That is, $n_2 < n_0 < n_1$. At least one of the material composition and the carrier concentration in each layer is adjusted so that the relationship $n_2 < n_0 < n_1$ is established.

The active layer 4 is laid on the diffraction grating embedding layer 3 so that the diffraction grating embedding layer 3 is interposed between the diffraction grating 2 and the active layer 4. The active layer 4 is laid on the diffraction grating embedding layer 3 and formed of an AlInGaAs-based or InGaAsP-based material.

The cladding layer 5 is provided on the active layer 4 and formed of an InGaAsP-based material.

Figure 2:
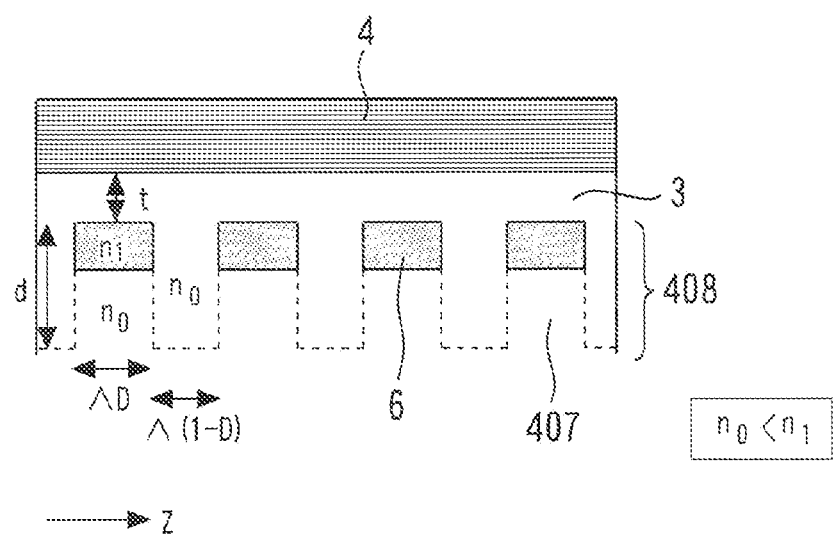
FIG. 2 is a sectional view of a semiconductor optical element according to a comparative example to be compared with the embodiment of the present invention.

FIG. 2 is a sectional view of a semiconductor optical element 400 according to a comparative example to be compared with the embodiment of the present invention. The semiconductor optical element 400 according to the comparative example is a DFB-LD using a diffraction grating 408 of a two-layer structure constituted by an upper portion 6 and a lower portion 407, as shown in section in FIG. 2. The upper portion 6 is the same as that in the first embodiment. The refractive index $n_1$ is higher than that of the diffraction grating embedding layer 3. On the other hand, the lower portion 407 has the same refractive index no as that of the diffraction grating embedding layer 3.

For convenience sake, the distance between the upper portion 6 and the active layer 4 is expressed as t; each of the depths of the diffraction gratings 2 and 408, d; each of the periods of the diffraction gratings 2 and 408, Λ; and the duty ratio, D. In a case where conditions for growth of the diffraction grating embedding layer 3 are fixed in the manufacturing process, the volume of the diffraction grating embedding layer 3 is constant and, therefore, a relationship as shown by equation (1) below is established. Accordingly, the distance t is reduced if the depth d is increased in each of the diffraction gratings 2 and 408.

$$tΛ+(1-D)Λd=C_0 (\text{constant}) \tag{1}$$

Figure 3:
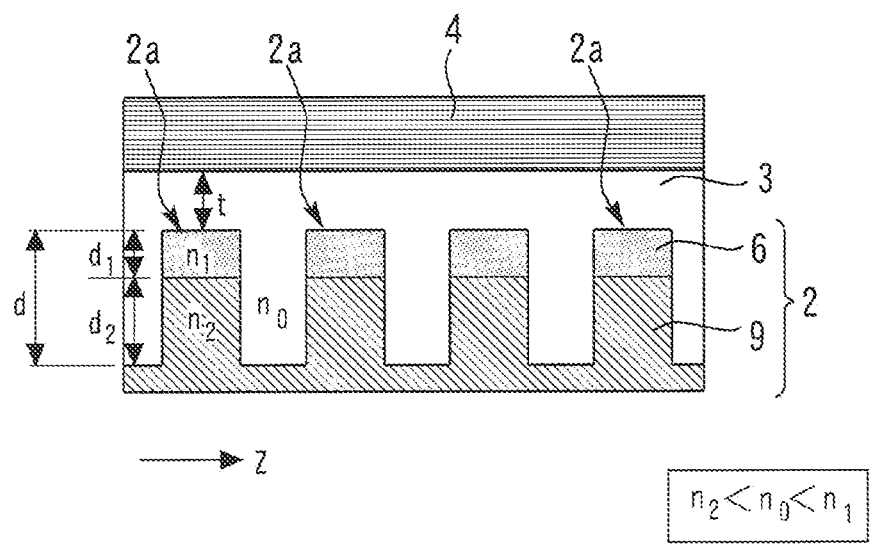
FIG. 3 is a sectional view of the semiconductor optical element according to the first embodiment of the present invention.

FIG. 3 is a sectional view of the semiconductor optical element 100 according to the first embodiment of the present invention. As shown in section in FIG. 3, the diffraction grating 2 in the semiconductor optical element 100 is constituted by the upper portions 6 having the higher refractive index $n_1$ and the lower portions 9 having the refractive index $n_2$ lower than that of the diffraction grating embedding layer 3. While the diffraction grating 2 is of a two-layer structure in the present embodiment, the diffraction grating 2 may alternatively be of a multilayer structure having three or more layers differing in refractive index from each other. An effective refractive index difference Δn in the diffraction grating 2 is approximated from a weighted average by equation (2) shown below, d1 representing the thickness of the upper portions 6, d2 representing the depth of the lower portions 9. The sum d of d1 and d2 equals the height of each grating element 2a of the diffraction grating 2, i.e., the depth of the groove between each adjacent pair of the grating elements 2a in the diffraction grating 2.

[Formula 1]

$$\Delta n \cong \frac{n_1 d_1 + n_2 d_2}{d_1 + d_2} - n_0 = \\ n_1 - n_0 - \frac{(n_1 - n_2)d_2}{d_1 + d_2} = n_1 - n_0 - \frac{(n_1 - n_2)(d - d_1)}{d} \tag{2}$$

An optical coupling coefficient κ is ordinarily expressed by equation (3) shown below. In equation (3), $k_0$ is a wave number; β, a propagation constant; $\Delta\epsilon_1$, a Fourier series of a perturbation $\Delta\epsilon(x, y, z)$ of a dielectric constant given by equation (4) shown below; and $U(x, y)$, a distribution of intensity of light. The direction in which each of the diffraction grating 2 and the diffraction grating 408 has the periodic structure is assumed to be the Z direction. The dielectric constants $\epsilon$ ordinarily proportional to the square of the refractive index n. With an increase in depth d and a reduction in distance t, the amount of overlap between light oozing out from the active layer 4 and the diffraction grating 2 or 408 increases. As a result, the optical coupling coefficient $\kappa$ with the diffraction grating 2 or 408 is increased.

[Formula 2] (3)

$$\kappa = \frac{k_0^2}{2\beta} \frac{\int\int \Delta\epsilon_l(x, y)|U(x, y)|^2 dxdy}{\int\int |U(x, y)|^2 dxdy}$$

[Formula 3] (4)

$$\Delta\epsilon(x, y, z) = \sum_{l\neq 0} \Delta\epsilon_l(x, y)e^{-jl(2\pi/\Lambda)z}$$

In the semiconductor optical element 400 according to the comparative example, the refractive index of the lower portion 407 and the refractive index of the embedding layer 3 are equal to each other and the refractive index is uniform around the upper portion 6. In this case, since d2=0, $\Delta$n is constant no matter what the depth d of the diffraction grating 408. With a reduction in distance t accompanying an increase in depth d, the intensity $|U(x, y)|^2$ of light oozing out from the active layer 4 increases while $\Delta$n is constantly maintained. The optical coupling coefficient $\kappa$ increases correspondingly.

On the other hand, in the semiconductor optical element 100 according to the first embodiment, the value of d2 is not zero, and the effective refractive index difference $\Delta$n is reduced due to the influence of the third term in equation (2) when the depth d of the diffraction grating 2 is increased, as shown by equation (2). In the semiconductor optical element 100 according to the first embodiment, the process in which the intensity $|U(x, y)|^2$ of light oozing out from the active layer 4 increases with a reduction in distance t and the process in which the effective refractive index difference $\Delta$n decreases cancel out each other. By this canceling effect, the increase in optical coupling coefficient $\kappa$ according to the increase in depth d can be limited and the change in optical coupling coefficient $\kappa$ can be limited even in a case where the depth d varies.

Figure 4:
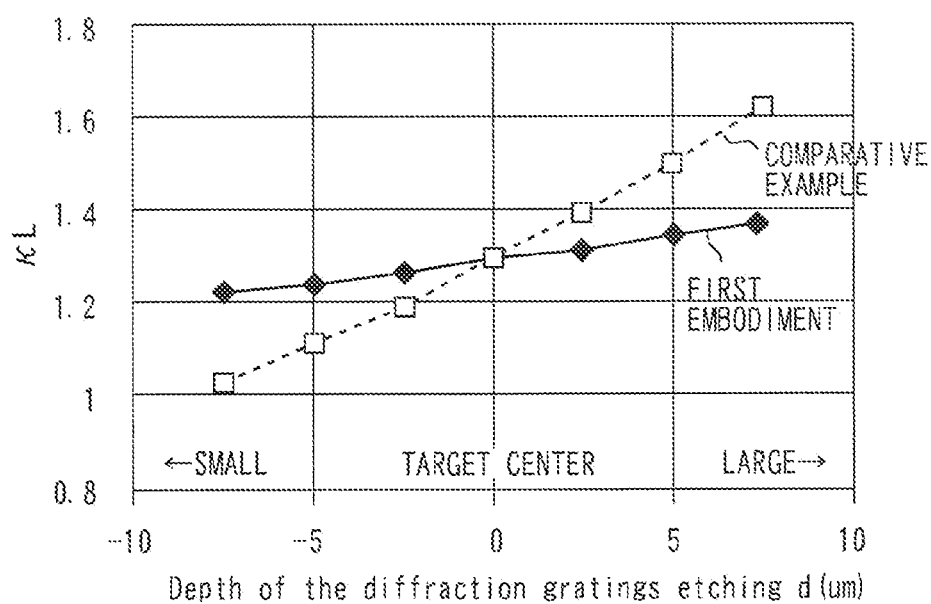
FIG. 4 is a diagram showing the advantage of the semiconductor optical element according to the first embodiment of the present invention.

FIG. 4 is a diagram showing the advantage of the semiconductor optical element 100 according to the first embodiment of the present invention. FIG. 4 is a graph showing, by way of example, the relationship between the product of the optical coupling coefficient $\kappa$ and the resonator length L ($\kappa$L) and the depth d of the diffraction gratings 2 and 408 with respect to the semiconductor optical element 400 in the comparative example and the semiconductor optical element 100 according to the first embodiment. As shown in FIG. 4, the depth d dependence of $\kappa$L, in the first embodiment is reduced relative to that in the comparative example. If the depth d dependence of $\kappa$L is large, there is a need to adjust the conditions for growth of the diffraction grating embedding layer 3 in order to limit manufacturing variations in depth d. The semiconductor optical element 100 according to the first embodiment has been improved so that the depth d dependence of $\kappa$L is reduced. As a result, the facility with which the optical coupling coefficient $\kappa$ is uniformly obtained is improved even when the conditions for growth of the diffraction grating embedding layer 3 are fixed, and the efficiency of manufacturing of the DFB-LD can be increased. An in-plane variation in optical coupling coefficient $\kappa$ can also be reduced in a case where a variation in depth d of the diffraction grating 2 occurs due to a gradient in the semiconductor wafer surface other than cases where variations occur in the process of manufacturing the diffraction grating 2.

In the present invention, the refractive-index-coupling-type diffraction grating 2 is used. Therefore, there is substantially no optical loss in the diffraction grating 2 and the invention has the advantage of limiting degradations in characteristics such as an increase in threshold current, a reduction in slope efficiency and an increase in power consumption in comparison with the semiconductor laser elements using gain-coupling-type diffraction gratings and described by way of example in Japanese Patent Laid-Open Nos. 2002-299758 and 5-29705.

In the first embodiment described above, the extent to which the optical coupling coefficient $\kappa$ changes depending on the depth d of the diffraction grating 2 can be limited. Therefore, the conditions for growth of the diffraction grating embedding layer 3 can be fixed and the manufacturing efficiency can be improved.

A modification may be made, for example, by setting the refractive index $n_0$ of the diffraction grating embedding layer 3 lower than the refractive index $n_2$ of the lower portion 9 (that is, $n_0 < n_2$) or by replacing the material of the diffraction grating embedding layer 3 with a material having such a low refractive index. In such a case, the refractive indices are in a relationship: $n_0 < n_2 < n_1$. Also in the case where this modification is made, $\Delta$n is reduced by the third term in equation (2) when the depth d of the diffraction grating 2 is increased in equation (2).

In the first embodiment, the refractive index is changed from one to the other of two values for the lower portion 9 and the upper portion 6. However, the present invention is not limited to this. The refractive index may be gradually changed from one to another of three values, four values or more than four values with change in position from the upper portion 6 to the lower portion 9. For example, the semiconductor optical element 100 may include, between the lower portion 9 and the upper portion 6, an intermediate portion having an intermediate refractive index between the refractive index of the lower portion 9 and the refractive index of the upper portion 6. This intermediate portion may be formed as a two-layer structure, a three-layer structure or a multilayer structure having a number of layers larger than three to form the diffraction grating 2 in a plurality of layers such that the refractive index is gradually reduced with change in position from the upper portion 6 to the lower portion 9.

Figure 5:
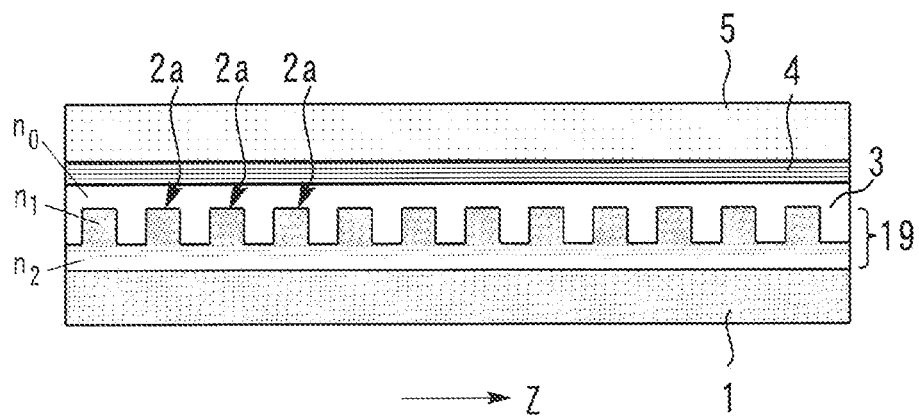
FIG. 5 is a sectional view of a semiconductor optical element according to a modified example of the first embodiment of the present invention.

FIG. 5 is a sectional view of a semiconductor optical element 101 according to a modified example of the first embodiment of the present invention. Each grating element 2a may have its refractive index continuously changed. A diffraction grating 19 may be formed in which the refractive index is continuously changed from a position in an uppermost portion to a position in a lowermost portion, as shown in FIG. 5. Except for this, the structure may be the same as that in the first embodiment. The refractive index of the lowermost portion of the diffraction grating 19 in this case is assumed to be lower than that of the diffraction grating embedding layer 3. Also in the case where this modification is made, $\Delta$n is reduced by the third term in equation (2) when the depth d of the diffraction grating 19 is increased in equation (2), thus obtaining the effect of limiting a variation in optical coupling coefficient κ as in the case of the semiconductor optical element 100 according to the first embodiment described above.

Figure 6:
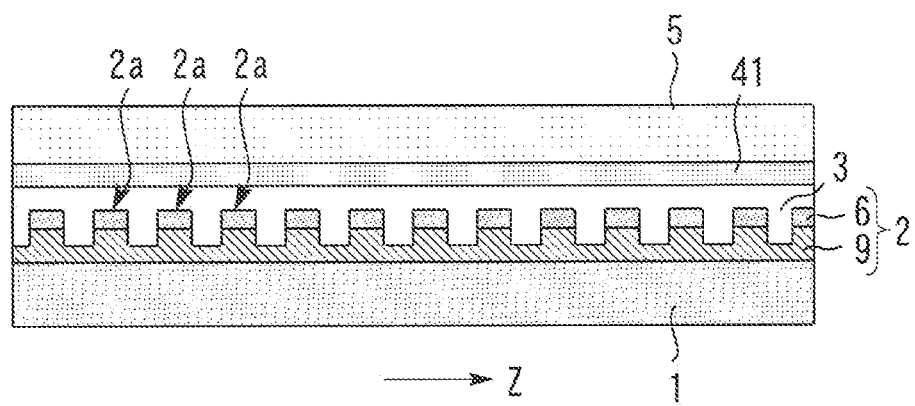
FIG. 6 is a sectional view of a semiconductor optical element according to another modified example of the first embodiment of the present invention.

FIG. 6 is a sectional view of a semiconductor optical element 150 according to another modified example of the first embodiment of the present invention. In the semiconductor optical element 150, the active layer 4 of the semiconductor optical element 100 according to the first embodiment is replaced with an optical waveguide layer 41. The optical waveguide layer 41 is laid in the diffraction grating embedding layer 3 so that the diffraction grating embedding layer 3 is interposed between the diffraction grating 2 and the optical waveguide layer 41. The optical waveguide layer 41 may be formed of an InGaAsP-based or AlInGaAs-based material. A waveguide-type optical device including a coupled waveguide and wavelength filter can thus be obtained in place of the semiconductor laser element. Also in the semiconductor optical element 150, Δn is reduced by the third term in equation (2) when the depth d of the diffraction grating 2 is increased in equation (2). A variation in optical coupling coefficient κ can therefore be limited. For the diffraction grating 2, the diffraction grating embedding layer 3 and the optical waveguide layer 41, InGaAs, InGaAsP or a semiconductor material containing Si may be used and a passive material such as a polymer or $SiO_2$ may alternatively be used.

Second Embodiment

Figure 7:
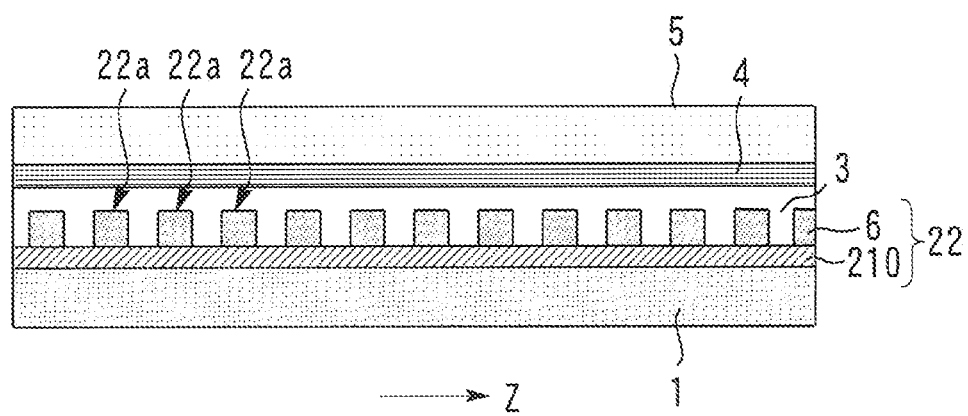
FIG. 7 is a sectional view of a semiconductor optical element according to a second embodiment of the present invention.

FIG. 7 is a sectional view of a semiconductor optical element 200 according to a second embodiment of the present invention. The semiconductor optical element 200 is of the same construction as that in the first embodiment except for a diffraction grating 22 substituted for the diffraction grating 2. The diffraction grating 22 has an upper portion 6 and a lower portion 210 provided in place of the lower portion 9, and has diffraction grating elements 22a arranged along the Z direction.

The lower portion 210 is formed of a material of a low etching rate in comparison with the material of the upper portion 6. This low-etching-rate material comprises AlGaInAs. Preferably, the etching rate of this low-etching-rate material is, for example, equal to or lower than 1/10 of the etching rate of the material of the upper portion 6. Since the etching rate of the lower portion 210 is lower than that of the upper portion 6, the depth d of the diffraction grating 22 does not change easily from the design value at the time of manufacturing. A variation in optical coupling coefficient κ due to a variation in depth d of the diffraction grating 22 can therefore be limited. The advantage of alleviating an in-plane variation in depth d of the diffraction grating 22 can also be obtained.

In the semiconductor optical element 200 according to the second embodiment, the active layer 4 may be replaced with the optical waveguide layer 41, as in the modified example of the first embodiment shown in FIG. 6.

Third Embodiment

Figure 8:
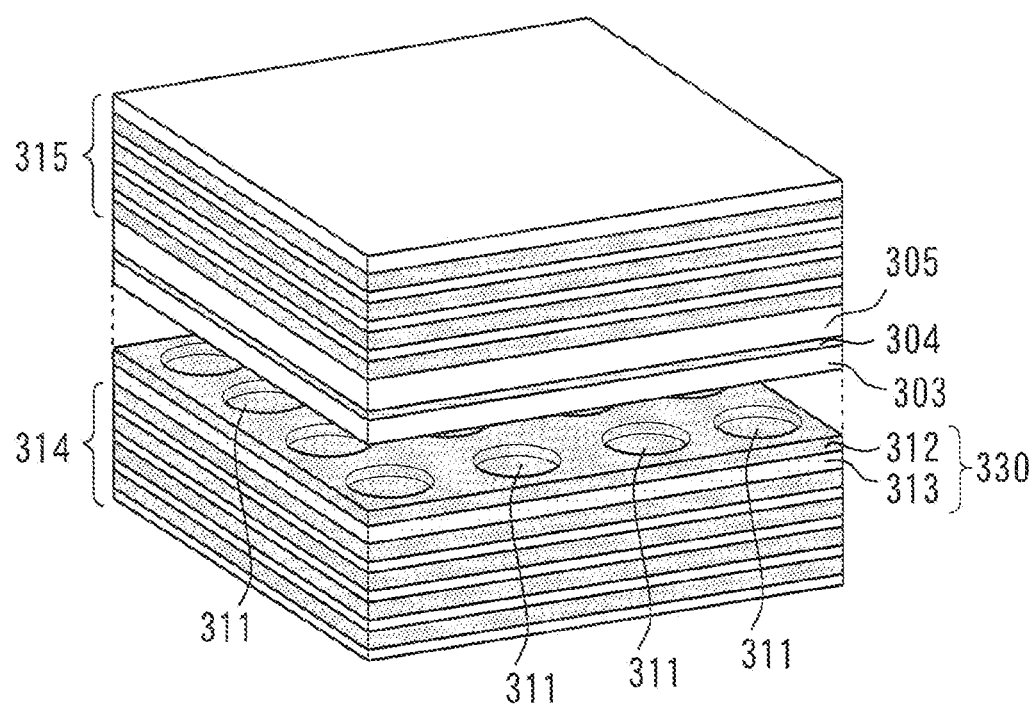
FIG. 8 is an exploded perspective view of a surface-emitting semiconductor optical element according to a third embodiment of the present invention.

FIG. 8 is an exploded perspective view of a surface-emitting semiconductor optical element 300 according to a third embodiment of the present invention. While an embedding layer 303 and a two-dimensional periodic structure layer 330 are illustrated in a state of being separated from each other in FIG. 8, these layers are in close contact with each other in the actual surface-emitting semiconductor optical element 300. The surface-emitting semiconductor optical element 300 is a surface-emitting laser element (vertical cavity surface emitting laser (VCSEL)). The surface-emitting semiconductor optical element 300 has the two-dimensional periodic structure layer 330, the embedding layer 303, an active layer 304, a cladding layer 305, and a pair of distributed Bragg reflectors (DBRs) 314 and 315 between which these layers are sandwiched.

The two-dimensional periodic structure layer 330 is a layer having a periodic structure along planar directions, more specifically a photonic crystal. The two-dimensional periodic structure layer 330 is a two-layer structure constituted by a first refractive index layer 312 and a second refractive index layer 313. The first refractive index layer 312 is positioned at the upper side (active layer 304 side) of the two-layer structure and has a higher refractive index. The second refractive index layer 313 is positioned at the lower side of the two-layer structure and has a refractive index lower than that of the first refractive index layer 312. That is, the first refractive index layer 312 positioned at the side closer to the active layer 304 is formed of a material having a refractive index higher than that of the second refractive index layer 313.

The first refractive index layer 312 has a plurality of recesses 311 which are arranged periodically at constant intervals in planar directions in the first refractive index layer 312. The plurality of recesses 311 are identical in contour shape as viewed in plan, depth and sectional structure to each other. However, the present invention is not limited to this. The position and shape of the plurality of recesses 311 and the intervals between the recesses 311 may be adjusted as desired. As described above, the two-dimensional periodic structure layer 330 has the plurality of recesses 311 and thereby has projections and recesses periodically arranged along planar directions. The first refractive index layer 312 forms portions on the projection side, while the second refractive index layer 313 forms portions positioned at the recess side relative to the first refractive index layer 312.

The embedding layer 303 is laid in the two-dimensional periodic structure layer 330 above the first refractive index layer 312 and the second refractive index layer 313 so as to cover these layers. The periodic projections and recesses on the first refractive index layer 312 are embedded in the embedding layer 303. Materials, for example, are selected for the second refractive index layer 313 and the embedding layer 303 such that the refractive index differs between these layers.

The active layer 304 and the cladding layer 305 are successively grown on the embedding layer 303. The two-dimensional periodic structure layer 330, the embedding layer 303 and the active layer 304 are sandwiched between the pair of distributed Bragg reflectors (DBRs) 314 and 315. The upper and lower DBRs 314 and 315 may be formed of an InGaAsP-based material, an AlInGaAs-based material or a semiconductor material containing Si or may be formed of a dielectric material containing $SiO_2$ or $Ta_2O_5$.

Resonance of light can be caused with the upper and lower DBRs 314 and 315, and the emitted beam shape can be changed into a doughnut shape or the beam can be set at an emergence angle by using two-dimensional diffraction through the embedded two-dimensional periodic structure layer 330 under the active layer 304. In the two-dimensional periodic structure layer 330, the refractive index is periodically changed along planar directions. The provision of the two-dimensional periodic structure layer 330 enables only the real part of the complex refractive index to be periodically changed in the resonator, thus obtaining a refractive-index-coupling-type surface-emitting laser element. Since the first refractive index layer 312 and the second refractive index layer 313 are provided in the upper and lower sections, respectively, of the two-dimensional periodic structure layer 330, a variation in optical coupling coefficient κ due to a variation in distance between the two-dimensional periodic structure layer 330 and the active layer 304 due to changes in in-plane projection/recess depth in the two-dimensional periodic structure layer 330 can be limited, as in the first embodiment. A modification may be made, for example, by removing the upper and lower distributed Bragg reflectors 314 and 315. A surface-light-emitting diode (LED) can also be obtained in this way.

The features and advantages of the present invention may be summarized as follows.

According to the first aspect of the present invention, the refractive index of the lower portion of the grating element is set lower than that of the upper portion, and the refractive indices of the lower portion and the embedding layer are set different from each other, thereby enabling the effective refractive index difference to be reduced when the depth of the grating element is increased. A variation in the optical coupling coefficient can thereby be limited.

According to the second aspect of the present invention, the etching rate of the lower portion is lower than that of the upper portion. Therefore, the depth of the diffraction grating does not charge easily with respect to the design value at the time of manufacturing. As a result, a variation in the optical coupling coefficient κ due to a variation in depth of the diffraction grating can be limited.

According to the third aspect of the present invention, an in-plane variation in the optical coupling coefficient can be limited even when an in-plane variation in the diffraction grating depth occurs.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2014-241903, filed on Nov. 28, 2014 including specification, claims, drawings and summary, on which the Convention priority of the present application is based, is incorporated herein by reference in its entirety.

What is claimed is:

1. A semiconductor optical element comprising:
a semiconductor substrate;
a refractive-index-coupling-type diffraction grating including a plurality of grating elements arranged on the semiconductor substrate, each of the grating elements including a lower portion provided on the semiconductor substrate and an upper portion provided on the lower portion, the upper portion having a first refractive index, the lower portion having a second refractive index lower than the first refractive index;
a diffraction grating embedding layer laid on the diffraction grating so that the diffraction grating is embedded, the diffraction grating embedding layer having a refractive index lower than the first refractive index and different from the second refractive index; and
an active layer or an optical waveguide layer laid on the diffraction grating embedding layer so that the diffraction grating embedding layer is interposed between the diffraction grating and the active layer or the optical waveguide layer,
wherein the lower portion of the diffraction grating is formed of a different material than the semiconductor substrate, and
wherein the lower portions of the plurality of grating elements are connected to each other to form a layer in a lower section of the diffraction grating.

2. The semiconductor optical element according to claim 1, wherein the diffraction grating embedding layer has an intermediate refractive index between the first refractive index and the second refractive index.

3. The semiconductor optical element according to claim 1, wherein the diffraction grating embedding layer has a refractive index lower than the second refractive index.

4. The semiconductor optical element according to claim 1, wherein an intermediate portion having an intermediate refractive index between the refractive index of the lower portion and the refractive index of the upper portion is provided between the lower portion and the upper portion.

5. The semiconductor optical element according to claim 1, wherein the refractive index of the grating element is continuously increased from a position in the lower portion to a position in the upper portion.

6. A semiconductor optical element comprising:
a semiconductor substrate;
a refractive-index-coupling-type diffraction grating including a plurality of grating elements arranged on the semiconductor substrate, each of the grating elements having a lower portion provided on the semiconductor substrate and an upper portion provided on the lower portion, the lower portion being formed of a material having an etching rate lower than that of the upper portion;
a diffraction grating embedding layer laid on the diffraction grating so that the diffraction grating is embedded, the diffraction grating embedding layer having a refractive index lower than the refractive index of the upper portion; and
an active layer or an optical waveguide layer laid on the diffraction grating embedding layer so that the diffraction grating embedding layer is interposed between the diffraction grating and the active layer or the optical waveguide layer,
wherein the lower portion of the diffraction grating is formed of a different material than the semiconductor substrate, and
wherein the lower portions of the plurality of grating elements are connected to each other to form a layer in a lower section of the diffraction grating.

7. A surface-emitting semiconductor optical element comprising:
a refractive-index-coupling-type periodic structure layer having projections and recesses periodically arranged in planar directions, the periodic structure layer including a first layer including the projections and recesses and a second layer in contact with the first layer having a refractive index lower than that of the first layer;
an embedding layer laid on the periodic structure layer such that the projections and recesses of the periodic structure layer are embedded in the embedding layer so as to cover the first layer and the second layer, the embedding layer having a refractive index lower than the refractive index of the first layer and different from the refractive index of the second layer; and
an active layer laid on the embedding layer,
wherein the first layer of the periodic structure layer is positioned at a side closer to the active layer than the second layer of the periodic structure layer.

8. The semiconductor optical element according to claim 7, further comprising a plurality of distributed Bragg reflectors provided so that the periodic structure layer, the embedding layer and the active layer are sandwiched between the distributed Bragg reflectors.

\* \* \* \* \*